United States Patent
Lee

(10) Patent No.: US 9,163,310 B2
(45) Date of Patent: Oct. 20, 2015

(54) ENHANCED DEPOSITION OF LAYER ON SUBSTRATE USING RADICALS

(75) Inventor: Sang In Lee, Sunnyvale, CA (US)

(73) Assignee: VEECO ALD Inc., Fremont, CA (US)

( * ) Notice: Subject to any disclaimer, the term of this patent is extended or adjusted under 35 U.S.C. 154(b) by 0 days.

(21) Appl. No.: 13/397,590

(22) Filed: Feb. 15, 2012

(65) Prior Publication Data

US 2012/0213945 A1  Aug. 23, 2012

Related U.S. Application Data

(60) Provisional application No. 61/444,651, filed on Feb. 18, 2011, provisional application No. 61/511,333, filed on Jul. 25, 2011.

(51) Int. Cl.
  *H05H 1/24* (2006.01)
  *C23C 16/455* (2006.01)
  *B05D 1/36* (2006.01)
  *B05D 1/38* (2006.01)
  *B05D 1/00* (2006.01)

(52) U.S. Cl.
  CPC ..... *C23C 16/45517* (2013.01); *C23C 16/45553* (2013.01); *B05D 1/36* (2013.01); *B05D 1/38* (2013.01); *B05D 1/60* (2013.01); *B05D 1/62* (2013.01)

(58) Field of Classification Search
  CPC ............. C23C 16/45517; C23C 16/45553; B05D 1/62; B05D 1/60; B05D 1/36; B05D 1/38
  USPC .................................................. 427/569–579
  See application file for complete search history.

(56) References Cited

U.S. PATENT DOCUMENTS

| | | | |
|---|---|---|---|
| 3,896,244 A | 7/1975 | Ellis et al. | |
| 4,891,247 A | 1/1990 | Shamshoian | |
| 5,120,568 A | 6/1992 | Schuurmans et al. | |
| 5,286,295 A | 2/1994 | Sauvinet et al. | |

(Continued)

FOREIGN PATENT DOCUMENTS

| | | | |
|---|---|---|---|
| CN | 1436602 A | 8/2003 | |
| EP | 0188208 A2 | 7/1986 | |

(Continued)

OTHER PUBLICATIONS

"Organic Compounds" (accessed Sep. 20, 2014 at http://dictionary.reference.com/browse/organic).*

(Continued)

*Primary Examiner* — Michael Wieczorek
*Assistant Examiner* — Michael G Miller
(74) *Attorney, Agent, or Firm* — Fenwick & West LLP

(57) ABSTRACT

Embodiments relate to using radicals to at different stages of deposition processes. The radicals may be generated by applying voltage across electrodes in a reactor remote from a substrate. The radicals are injected onto the substrate at different stages of molecular layer deposition (MLD), atomic layer deposition (ALD), and chemical vapor deposition (CVD) to improve characteristics of the deposited layer, enable depositing of material otherwise not feasible and/or increase the rate of deposition. Gas used for generating the radicals may include inert gas and other gases. The radicals may disassociate precursors, activate the surface of a deposited layer or cause cross-linking between deposited molecules.

19 Claims, 11 Drawing Sheets

(56) References Cited

U.S. PATENT DOCUMENTS

| | | | |
|---|---|---|---|
| 5,300,189 A | 4/1994 | Kokaku et al. |
| 5,368,897 A | 11/1994 | Kurihara et al. |
| 5,549,780 A | 8/1996 | Koinuma et al. |
| 5,560,777 A | 10/1996 | Ahn |
| 5,565,249 A | 10/1996 | Kurihara et al. |
| 5,567,243 A | 10/1996 | Foster et al. |
| 5,578,130 A | 11/1996 | Hayashi et al. |
| 5,665,640 A | 9/1997 | Foster et al. |
| 5,711,814 A | 1/1998 | Mori |
| 5,820,947 A | 10/1998 | Itoh |
| 5,863,337 A | 1/1999 | Neuman et al. |
| 5,879,459 A | 3/1999 | Gadgil et al. |
| 5,951,771 A | 9/1999 | Raney et al. |
| 6,022,414 A | 2/2000 | Miller et al. |
| 6,051,150 A | 4/2000 | Miyakawa |
| 6,079,353 A | 6/2000 | Leksell et al. |
| 6,099,974 A | 8/2000 | Lenling |
| 6,143,077 A | 11/2000 | Ikeda et al. |
| 6,319,615 B1 | 11/2001 | Jansen |
| 6,354,109 B1 | 3/2002 | Boire et al. |
| 6,406,590 B1 | 6/2002 | Ebata et al. |
| 6,416,822 B1 | 7/2002 | Chiang et al. |
| 6,424,091 B1 | 7/2002 | Sawada et al. |
| 6,435,428 B2 | 8/2002 | Kim et al. |
| 6,521,048 B2 | 2/2003 | Miller et al. |
| 6,641,673 B2 | 11/2003 | Yang |
| 6,656,831 B1 | 12/2003 | Lee et al. |
| 6,730,614 B1 | 5/2004 | Lim et al. |
| 6,824,816 B2 | 11/2004 | Aaltonen et al. |
| 6,926,572 B2 | 8/2005 | Park et al. |
| 6,972,055 B2 | 12/2005 | Sferlazzo |
| 6,997,371 B2 | 2/2006 | Shabtay |
| 7,118,779 B2 | 10/2006 | Verghese et al. |
| 7,361,548 B2 | 4/2008 | Lim et al. |
| 7,494,545 B2 | 2/2009 | Lam et al. |
| 7,754,013 B2 | 7/2010 | Granneman |
| 7,886,688 B2 | 2/2011 | Takeuchi et al. |
| 7,914,847 B2 | 3/2011 | Verghese et al. |
| 7,943,527 B2 | 5/2011 | Kumar et al. |
| 7,981,472 B2 | 7/2011 | Dalton et al. |
| 8,257,799 B2 | 9/2012 | Lee |
| 8,328,982 B1 | 12/2012 | Babayan et al. |
| 2001/0047759 A1 | 12/2001 | Matsui et al. |
| 2002/0092616 A1 | 7/2002 | Kim |
| 2002/0100418 A1 | 8/2002 | Sandhu et al. |
| 2002/0112819 A1 | 8/2002 | Kamarehi et al. |
| 2002/0197864 A1 | 12/2002 | Sneh |
| 2003/0049375 A1 | 3/2003 | Nguyen et al. |
| 2003/0072881 A1 | 4/2003 | Yang et al. |
| 2003/0143328 A1 | 7/2003 | Chen et al. |
| 2003/0207593 A1* | 11/2003 | Derderian et al. ............ 438/778 |
| 2003/0214043 A1 | 11/2003 | Saitoh et al. |
| 2004/0009307 A1 | 1/2004 | Koh et al. |
| 2004/0052972 A1 | 3/2004 | Schmitt |
| 2004/0067641 A1 | 4/2004 | Yudovsky |
| 2004/0083967 A1 | 5/2004 | Yuda et al. |
| 2004/0129212 A1 | 7/2004 | Gadgil et al. |
| 2004/0171280 A1 | 9/2004 | Conley et al. |
| 2004/0224527 A1 | 11/2004 | Sarigiannis et al. |
| 2004/0247787 A1 | 12/2004 | Mackie et al. |
| 2004/0261946 A1 | 12/2004 | Endoh et al. |
| 2005/0016457 A1 | 1/2005 | Kawasaki et al. |
| 2005/0064207 A1 | 3/2005 | Senzaki et al. |
| 2005/0064236 A1 | 3/2005 | Lim et al. |
| 2005/0106094 A1 | 5/2005 | Kondo |
| 2005/0183768 A1 | 8/2005 | Roscheisen et al. |
| 2006/0019033 A1 | 1/2006 | Muthukrishnan et al. |
| 2006/0068519 A1* | 3/2006 | Dunbar et al. .................. 438/82 |
| 2006/0072281 A1 | 4/2006 | Nam et al. |
| 2006/0183301 A1 | 8/2006 | Yeom et al. |
| 2006/0211243 A1 | 9/2006 | Ishizaka et al. |
| 2006/0213441 A1* | 9/2006 | Kobrin et al. .................. 118/715 |
| 2006/0237399 A1 | 10/2006 | Horner-Richardson et al. |
| 2006/0240665 A1 | 10/2006 | Kang et al. |
| 2007/0082500 A1 | 4/2007 | Norman et al. |
| 2007/0087579 A1 | 4/2007 | Kitayama et al. |
| 2007/0145023 A1 | 6/2007 | Holber et al. |
| 2007/0224348 A1 | 9/2007 | Dickey et al. |
| 2007/0237699 A1 | 10/2007 | Clark |
| 2007/0243325 A1 | 10/2007 | Sneh |
| 2007/0264488 A1 | 11/2007 | Lee |
| 2007/0281082 A1 | 12/2007 | Mokhlesi et al. |
| 2007/0281089 A1 | 12/2007 | Heller et al. |
| 2008/0026162 A1 | 1/2008 | Dickey et al. |
| 2008/0075881 A1 | 3/2008 | Won et al. |
| 2008/0092953 A1 | 4/2008 | Lee |
| 2008/0106202 A1 | 5/2008 | Du et al. |
| 2008/0206967 A1 | 8/2008 | Miyairi et al. |
| 2008/0241387 A1 | 10/2008 | Keto |
| 2008/0260963 A1 | 10/2008 | Yoon et al. |
| 2009/0017190 A1 | 1/2009 | Sferlazzo et al. |
| 2009/0044661 A1 | 2/2009 | Li et al. |
| 2009/0068849 A1 | 3/2009 | Endo et al. |
| 2009/0102385 A1 | 4/2009 | Wi |
| 2009/0130858 A1 | 5/2009 | Levy |
| 2009/0133714 A1 | 5/2009 | Yamazaki et al. |
| 2009/0165715 A1 | 7/2009 | Oh |
| 2009/0170345 A1 | 7/2009 | Akae et al. |
| 2009/0197406 A1 | 8/2009 | Cao et al. |
| 2009/0202817 A1 | 8/2009 | Durandeau et al. |
| 2009/0286381 A1 | 11/2009 | Van Schravendijk et al. |
| 2009/0291211 A1 | 11/2009 | Ryu et al. |
| 2010/0037820 A1 | 2/2010 | Lee |
| 2010/0037824 A1 | 2/2010 | Lee |
| 2010/0048029 A1 | 2/2010 | Kumar et al. |
| 2010/0055347 A1 | 3/2010 | Kato et al. |
| 2010/0064971 A1 | 3/2010 | Lee |
| 2010/0068413 A1 | 3/2010 | Lee |
| 2010/0124618 A1 | 5/2010 | Kobayashi et al. |
| 2010/0181566 A1 | 7/2010 | Lee |
| 2010/0189900 A1 | 7/2010 | Dickey et al. |
| 2010/0215871 A1 | 8/2010 | Lee |
| 2010/0221426 A1 | 9/2010 | Sferlazzo |
| 2010/0255625 A1* | 10/2010 | De Vries ........................ 438/57 |
| 2010/0304047 A1 | 12/2010 | Yang et al. |
| 2010/0310771 A1 | 12/2010 | Lee |
| 2011/0017997 A1 | 1/2011 | Kamath et al. |
| 2011/0070380 A1 | 3/2011 | Shero et al. |
| 2012/0021252 A1 | 1/2012 | Lee |
| 2012/0094149 A1 | 4/2012 | Lee |
| 2012/0114877 A1 | 5/2012 | Lee |
| 2012/0125258 A1 | 5/2012 | Lee |
| 2012/0207948 A1 | 8/2012 | Lee |
| 2012/0225204 A1 | 9/2012 | Yudovsky |
| 2012/0301632 A1 | 11/2012 | Lee |

FOREIGN PATENT DOCUMENTS

| | | |
|---|---|---|
| EP | 0499524 A1 | 2/1992 |
| FR | 2736632 A1 | 1/1997 |
| JP | S62-081018 A | 4/1987 |
| JP | H01-096924 A | 4/1989 |
| JP | 1-161835 A | 6/1989 |
| JP | H01-223724 A | 9/1989 |
| JP | H2-187018 | 7/1990 |
| JP | H04-092414 A | 3/1992 |
| JP | H09-064000 A | 3/1997 |
| JP | 09-167757 A | 6/1997 |
| JP | 09-199738 A | 7/1997 |
| JP | 11-092943 A | 4/1999 |
| JP | 2001-357780 A | 12/2001 |
| JP | 2002-018276 A | 1/2002 |
| JP | 2003-049272 A | 2/2003 |
| JP | 2003-073835 A | 3/2003 |
| JP | 2003-174019 A | 6/2003 |
| JP | 2003-324070 | 11/2003 |
| JP | 2004-010949 A | 1/2004 |
| JP | 2004-091837 A | 3/2004 |
| JP | 2005-089781 A | 4/2005 |
| JP | 2005-116898 | 4/2005 |
| JP | 2005-347245 A | 5/2005 |
| JP | 2006-236697 A | 9/2006 |
| JP | 2007-019460 A | 1/2007 |
| JP | 2007-191792 | 8/2007 |

(56) References Cited

FOREIGN PATENT DOCUMENTS

| | | |
|---|---|---|
| JP | 2007-266093 A | 10/2007 |
| JP | 2008-108895 A | 5/2008 |
| JP | 2010-538165 A | 12/2010 |
| KR | 100175011 B1 | 11/1998 |
| KR | 10-2001-0040561 | 5/2001 |
| KR | 10-2002-0078804 | 10/2002 |
| KR | 10-2002-0083564 A | 11/2002 |
| KR | 10-0631972 | 8/2003 |
| KR | 10-2004-0042209 A | 5/2004 |
| KR | 10-2005-0015931 A | 2/2005 |
| KR | 10-2005-0044797 A | 5/2005 |
| KR | 10-2005-0113423 | 12/2005 |
| KR | 10-0542736 | 1/2006 |
| KR | 10-2006-0117607 | 11/2006 |
| KR | 10-0673211 B1 | 1/2007 |
| KR | 10-2007-0051332 | 5/2007 |
| KR | 10-2007-0076955 A | 7/2007 |
| KR | 10-2007-0096770 A | 10/2007 |
| KR | 10-2007-0101127 A | 10/2007 |
| KR | 10-2007-0101360 A | 10/2007 |
| KR | 10-0771926 A | 10/2007 |
| KR | 10-2008-0067042 A | 7/2008 |
| KR | 10-2010-0020919 | 2/2010 |
| KR | 10-2010-0020920 | 2/2010 |
| KR | 10-2010-0061733 | 6/2010 |
| WO | WO 2006/054854 A1 | 5/2006 |
| WO | WO 2007/134322 A2 | 11/2007 |
| WO | WO 2007/144536 A1 | 12/2007 |
| WO | WO 2008/130369 A1 | 10/2008 |
| WO | WO 2009/031886 A2 | 3/2009 |
| WO | WO 2010/138102 A1 | 12/2010 |

OTHER PUBLICATIONS

"What is Plasma" (accessed online Sep. 20, 2014 at http://www.nordson.com/en-us/divisions/march/about-march/Pages/WhatIsPlasma.aspx).*
Dameron, A.A. et al., "Molecular Layer Deposition of Alucone Polymer Films Using Trimethylaluminum and Ethylene Glycol," Chem. Mater., 2008, pp. 3315-3326, vol. 20.
PCT Written Opinion, PCT Application No. PCT/KR2010/001076, Sep. 27, 2010, 8 pages.
PCT International Search Report and Written Opinion, PCT Application No. PCT/US11/44470, Dec. 7, 2011, 13 pages.
PCT International Search Report and Written Opinion, PCT Application No. PCT/US2011/056285, Mar. 8, 2012, 11 pages.
PCT International Search Report and Written Opinion, PCT Application No. PCT/US11/58552, Mar. 14, 2012, 12 pages.
PCT International Search Report and Written Opinion, PCT Application No. PCT/US2011/060474, Mar. 22, 2012, 12 pages.
PCT Invitation to Pay Additional Fees, PCT Application No. PCT/US12/25095, May 22, 2012, 2 pages.
PCT International Search Report and Written Opinion, PCT Application No. PCT/US12/25483, May 29, 2012, 10 pages.
U.S. Appl. No. 13/185,793, filed Jul. 19, 2011, Inventor: Sang In Lee.
U.S. Appl. No. 13/273,076, filed Oct. 13, 2011, Inventor: Sang In Lee.
U.S. Appl. No. 13/285,417, filed Oct. 31, 2011, Inventor: Sang In Lee.
U.S. Appl. No. 13/295,012, filed Nov. 11, 2011, Inventor: Sang In Lee.
U.S. Appl. No. 13/369,717, filed Feb. 9, 2012, Inventor: Sang In Lee.
European Extended Search Report, European Application No. 10786646.9, Nov. 29, 2012, 17 pages.
29, 2012, 17 pages.
PCT International Search Report and Written Opinion, PCT Application No. PCT/US12/25095, Aug. 3, 2012, 18 pages.
Chinese First Office Action, Chinese Application No. 201080025311.3, Jun. 25, 2013, 14 pages.
Japanese First Office Action, Japanese Application No. 2012-514229, Jul. 17, 2013, 8 pages.
Choi, J. M. et al., "Ultraviolet Enhanced Si-Photodetector Using p-NiO Films," Applied Surface Science, May 15, 2005, pp. 435-438, vol. 244, No. 1-4.
European Extended Search Report, European Application No. 10733634.9, Jan. 30, 2013, 5 pages.
Hermle, M. et al., "Analyzing the Effects of Front-Surface Fields on Back-Junction Silicon Solar Cells Using the Charge-Collection Probability and the Reciprocity Theorem," Journal of Applied Physics, Mar. 10, 2008, 7 pages, vol. 103, No. 5.
Kymakis, E. et al., "Bi-Layer Photovoltaic Devices with PPQ as the Electron Acceptor Layer," Solar Energy Materials & Solar Cells, Jul. 24, 2006, pp. 1705-1714, vol. 90, No. 12.
Verlinden, P. et al., "Measurement of Diffusion Length and Surface Recombination Velocity in Interdigitated Back Contact (IBC) and Front Surface Field (FSF) Solar Cells," Physica, 1985, pp. 317-321, vol. 129, No. 1-3.
Yoshikawa. O. et al., "Enhanced Efficiency and Stability in P3HT:PCBM Bulk Heterojunction Solar Cell by Using TiO2 Hole Blocking Layer," Mater. Res. Soc. Symp. Proc., Materials Research Society, Jan. 2007, 6 pages.
He, G. et al., "Metal-Organic Chemical Vapor Deposition of Aluminum Oxynitride from Propylamine-Dimethylaluminum Hydride and Oxygen: Growth Mode Dependence and Performance Optimization," Journal of Materials Chemistry, 2012, pp. 7468-7477, vol. 22.
Zhu, M. et al., "Aluminum Oxynitride Interfacial Passivation Layer for High-Permittivity Gate Dielectric Stack on Gallium Arsenide," Applied Physics Letters, 202903, 2006, pp. 1-3, vol. 89.
Taiwan Office Action, Taiwan Application No. 101105141, Nov. 25, 2013, 11 pages.
Taiwan Office Action, Taiwan Application No. 101105355, Dec. 30, 2013, 13 pages.
pages.
Bosund, M. et al., "Properties of AlN Grown by Plasma Enhanced Atomic Layer Deposition," Applied Surface Science, 2011, pp. 7827-7830, vol. 257.
Eom, D. et al., "Properties of Aluminum Nitride Thin Films Deposited by an Alternate Injection of Trimethylaluminum and Ammonia Under Ultraviolet Radiation," Journal of the Electrochemical Society, 2006, pp. C229-C234, vol. 153, No. 4.
Korean Office Action, Korean Application No. 10-2013-7004108, May 26, 2014, 12 pages.
European Examination Report, European Patent Application No. 10786646.9, Oct. 24, 2013, 5 pages.
Maydannik, P.S. et al., "An Atomic Layer Deposition Process for Moving Flexible Substrates," Chemical Engineering Journal, 2011, pp. 345-349, vol. 171.
Taiwan Office Action, Taiwan Application No. 100126066, Oct. 8, 2013, 14 pages.
Korean Office Action, Korean Application No. 10-2013-7004108, Nov. 25, 2014, 5 pages (with concise explanation of relevance).
Taiwan Office Action, Taiwan Application No. 101105141, Sep. 4, 2014, 6 pages.
Korean Office Action, Korean Application No. 10-2013-7024159, Jan. 7, 2015, 10 pages (with concise explanation of relevance).
Korean Office Action, Korean Application No. 10-2013-7024157, Jan. 8, 2015, 13 pages.
Korean Office Action, Korean Application No. 10-2013-7004108, Jan. 29, 2015, 5 pages (with concise explanation of relevance).
United States Office Action, U.S. Appl. No. 13/185,793, Jan. 23, 2015, 18 pages.
United States Office Action, U.S. Appl. No. 13/185,793, May 20, 2015, 17 pages.
Korean Office Action, Korean Application No. 10-2013-7024159, Jul. 31, 2015, 4 pages (with concise explanation of relevance).
Korean Office Action, Korean Application No. 10-2013-7024157, Jul. 30, 2015, 6 pages (with concise explanation of relevance).

* cited by examiner

ENHANCED DEPOSITION OF LAYER ON SUBSTRATE USING RADICALS

CROSS-REFERENCE TO RELATED APPLICATION

This application claims priority under 35 U.S.C. §119(e) to U.S. Provisional Patent Application No. 61/444,651, filed on Feb. 18, 2011; and U.S. Provisional Patent Application No. 61/511,333, filed on Jul. 25, 2011, which are incorporated by reference herein in their entirety.

BACKGROUND

1. Field of Art

The disclosure relates to depositing one or more layers of materials on a substrate by using radicals generated by a remote plasma device.

2. Description of the Related Art

Various chemical processes are used to deposit one or more layers of material on a substrate. Such chemical processes include chemical vapor deposition (CVD), atomic layer deposition (ALD) and molecular layer deposition (MLD). CVD is the most common method for depositing a layer of material on a substrate. In CVD, reactive gas precursors are mixed and then delivered to a reaction chamber where a layer of material is deposited after the mixed gas comes into contact with the substrate.

ALD is another way of depositing material on a substrate. ALD uses the bonding force of a chemisorbed molecule that is different from the bonding force of a physisorbed molecule. In ALD, source precursor is adsorbed into the surface of a substrate and then purged with an inert gas. As a result, physisorbed molecules of the source precursor (bonded by the Van der Waals force) are desorbed from the substrate. However, chemisorbed molecules of the source precursor are covalently bonded, and hence, these molecules are strongly adsorbed in the substrate and not desorbed from the substrate. The chemisorbed molecules of the source precursor (adsorbed on the substrate) react with and/or are replaced by molecules of reactant precursor. Then, the excessive precursor or physisorbed molecules are removed by injecting the purge gas and/or pumping the chamber, obtaining a final atomic layer.

MLD is a thin film deposition method similar to ALD but in MLD, molecules are deposited onto the substrate as a unit to form polymeric films on a substrate. In MLD, a molecular fragment is deposited during each reaction cycle. The precursors for MLD have typically been homobifunctional reactants. MLD method is used generally for growing organic polymers such as polyamides on the substrate. The precursors for MLD and ALD may also be used to grow hybrid organic-inorganic polymers such as Alucone (i.e., aluminum alkoxide polymer having carbon-containing backbones obtained by reacting trimethylaluminum (TMA: $Al(CH_3)_3$) and ethylene glycol) or Zircone (hybrid organic-inorganic systems based on the reaction between zirconium precursor (such as zirconium t-butoxide $Zr[OC(CH_3)_3]_4$, or tetrakis(dimethylamido)zieconium $Zr[N(CH_3)_2]_4$) with diol (such as ethylene glycol)).

Each of these deposition processes are subject to various limitations. Such limitations include, for example, (i) the deposition rate, (ii) restrictions on the precursor materials that can be used, and (iii) inconstancies in the deposited layer.

SUMMARY

Embodiments relate to performing molecular layer deposition using radicals to place the deposited layer in a reactive state to perform a subsequent deposition process. A first source precursor including a compound (e.g., metal-organic compound) is injected onto a substrate. A reactant precursor including an organic compound is injected on the substrate injected with the first source precursor to deposit a layer on the substrate. Radicals of a gas or a mixture of gases are generated and injected onto the substrate to place the deposited layer in a reactive state.

In one embodiment, the substrate is injected with a second source precursor where the deposited layer on the substrate is placed in the reactive state before being injected with the second source precursor. The absorption of the second source precursor on the deposited layer is facilitated by an increased number of nucleation sites on the deposited layer generated by placing the deposited layer in the reactive state.

In one embodiment, a purge gas is injected onto the substrate after injecting the first precursor and before injecting the reactant precursor to remove physisorbed first source precursor from the substrate.

In one embodiment, a physisorbed layer deposited on the substrate is removed by the gas or the mixture of gases reverted to an inactive state from the radicals.

In one embodiment, a first reactant precursor is injected onto the substrate previously injected with the first source precursor. Further, radicals of gas or a mixture of gases are generated and injected onto the substrate previously injected with the first reactant precursor. Processes may be repeated for a predetermined number of times to deposit a hybrid organic-inorganic polymer on the substrate.

In one embodiment, a second source precursor is injected onto the substrate previously injected with the first reactant precursor. Further, radicals of gas or a mixture of gases are generated and injected onto the substrate previously injected with the second source precursor. Processes may be repeated for a predetermined number of times to deposit a hybrid organic-inorganic polymer on the substrate.

In one embodiment, a second reactant precursor is injected onto the substrate previously injected with the second source precursor. Further, radicals of gas or a mixture of gases are generated and injected onto the substrate previously injected with the second reactant precursor. Processes may be repeated for a predetermined number of times to deposit a hybrid organic-inorganic polymer on the substrate.

In one embodiment, the first source precursor and the second source precursor are metal-containing precursor such as trimethylaluminum (TMA) or Hexamethyldisilazane $\{(CH_3)_3Si\}_2NH$, the first reactant precursor is diol (e.g., ethylene glycol), and the second reactant precursor is aromatic hydrocarbon (e.g., as toluene and aniline).

In one embodiment, the first source precursor is TMA or zirconium t-butoxide and the first reactant precursor is ethylene glycol. The ethylene glycol reacts with the radicals and then TMA. By reacting with the radicals, carbon links in the ethylene glycol are broken up, facilitating subsequent reaction with TMA.

In one embodiment, the radicals are generated at a location remote from the substrate by generating plasma. In this way, the generate plasma does not negatively affect devices previously formed on the substrate.

In one embodiment, the deposited layer is a hybrid organic-inorganic layer. More specifically, the deposited layer is polymeric atomic layer (e.g., alucone) where carbon atoms in a plurality of molecules are cross-linked.

Embodiments also relate to a method of performing a molecular layer deposition by injecting aromatic hydrocarbon as source precursor onto a surface of a substrate, breaking hydrocarbon rings on the surface of the substrate by injecting radicals of inert gas onto the surface of the substrate. By breaking the hydrocarbon rings, the surface of the substrate is rendered reactive. The aromatic hydrocarbon may again be injected onto the reactive surface. The process may be repeated to form a polymeric layer on the substrate.

In one embodiment, purge gas is injected after injecting the aromatic hydrocarbon on the surface of the substrate to remove physisorbed aromatic hydrocarbon from the surface of the substrate.

In one embodiment, physisorbed source precursor is removed from the substrate by inert gas reverted from the radicals.

In one embodiment, the aromatic hydrocarbon is aromatic hydrocarbon comprises one or more of toluene, aniline and derivatives of benzene.

In one embodiment, the substrate moves below an injector configured to inject the aromatic hydrocarbon and a radical reactor configured to inject radicals of the inert gas.

In one embodiment, the radicals are generated at a location remote from the surface of the substrate.

Embodiments also relate to a method of performing atomic layer deposition (ALD) using radicals to disassociate reactant precursor molecules. Radicals are generated and injected onto the substrate. The radicals come into contact with the reactant precursor molecules and disassociate the reactant precursor molecules. The disassociated molecules are more easily adsorbed on the substrate compared to the inactive reactant precursor molecules. A reactant precursor is injected onto the substrate with the radicals to deposit a layer of material on the substrate.

In one embodiment, physisorbed source precursor are removed from the substrate by inert gas reverted from the radicals.

In one embodiment, purge gas is injected onto the substrate deposited with the layer to remove physisorbed material from the substrate.

In one embodiment, the source precursor for the atomic layer deposition may be one or more of $SiH_4$, $TiCl_4$, $SiCl_2H_2$, $AlCl_3$, $WF_6$, Trimethylaluminum [$(CH_3)_3Al$], Tris(dimethylamino)silane [$(CH_3)_2NSiH$], and Tetrakis(ethylmethylamino)zirconium [$\{(CH_3)(C_2H_5)N\}_4Zr$].

In one embodiment, the reactant precursor for the atomic layer deposition may include $NH_3$.

Embodiments also relate to a method of performing chemical vapor deposition (CVD) using radicals. A source precursor is injected into a reaction zone. Radicals or reactant precursor are generated and injected into the reaction zone to cause reaction between the generated radicals and the injected source precursor. A portion of a substrate is moved into the reaction zone to deposit a layer on the portion of the substrate.

In one embodiment, the source precursor for the chemical vapor deposition includes one or more of $SiH_4$, $TiCl_4$, $SiCl_2H_2$, $AlCl_3$, $WF_6$, and a metal-organic compound. The metal organic compound may be one of Trimethylaluminum [$(CH_3)_3Al$], Tris(dimethylamino)silane [$\{(CH_3)_2N\}_3SiH$], Tetrakis(ethylmethylamino)silicon [$\{(CH_3)(C_2H_5)N\}_4Si$], and Hexamethyldisilazane $\{(CH_3)_3Si\}_2NH$.

In one embodiment, the generated radicals for the chemical vapor deposition includes N*.

In one embodiment, the deposited layer formed by the chemical vapor deposition includes SiN. In one embodiment, the source precursor is injected by a gas injector. The radicals are generated by a radical reactor, and the reaction zone is a portion shared by the gas injector and the radical reactor to discharge gas or radicals from the gas injector and the radical reactor.

DETAILED DESCRIPTION OF EMBODIMENTS

Figure 1:
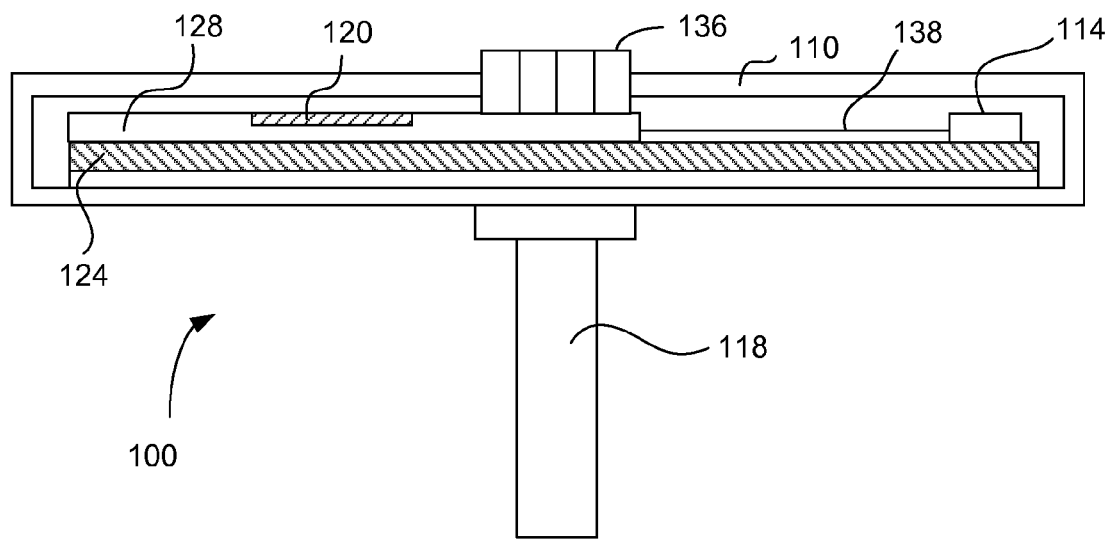
FIG. 1 is a cross sectional diagram of a linear deposition device, according to one embodiment.

Embodiments are described herein with reference to the accompanying drawings. Principles disclosed herein may, however, be embodied in many different forms and should not be construed as being limited to the embodiments set forth herein. In the description, details of well-known features and techniques may be omitted to avoid unnecessarily obscuring the features of the embodiments.

In the drawings, like reference numerals in the drawings denote like elements. The shape, size and regions, and the like, of the drawing may be exaggerated for clarity.

Embodiments relate to using radicals at different stages of deposition processes. The radicals may be generated by applying voltage across electrodes in a reactor remote from a substrate. The radicals are injected onto the substrate at different stages of molecular layer deposition (MLD), atomic layer deposition (ALD), and chemical vapor deposition (CVD) to improve characteristics of the deposited layer, enable depositing of material otherwise not feasible and/or increase the rate of deposition. Gas used for generating the radicals may include inert gas and other gases. The radicals may disassociate precursors, activate the surface of a deposited layer or generate cross-linking between deposited molecules.

Example Apparatus for Performing Deposition

Figure 2:
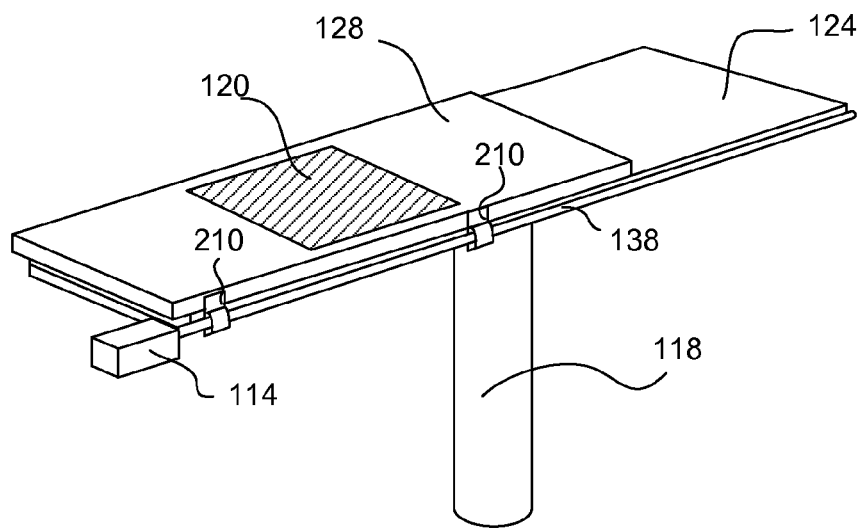
FIG. 2 is a perspective view of a linear deposition device, according to one embodiment.

FIG. 1 is a cross sectional diagram of a linear deposition device 100, according to one embodiment. FIG. 2 is a perspective view of the linear deposition device 100 (without chamber walls to facilitate explanation), according to one embodiment. The linear deposition device 100 may include, among other components, a support pillar 118, the process chamber 110 and one or more reactors 136. The reactors 136 may include one or more of injectors and radical reactors for performing MLD, ALD and/or CVD. Each of the injectors injects source precursors, reactant precursors, purge gases or a combination of these materials onto the substrate 120. The gap between the injector and the substrate 120 may be 0.5 mm to 1.5 mm.

The process chamber enclosed by walls may be maintained in a vacuum state to prevent contaminants from affecting the deposition process. The process chamber 110 contains a susceptor 128 which receives a substrate 120. The susceptor 128 is placed on a support plate 124 for a sliding movement. The support plate 124 may include a temperature controller (e.g., a heater or a cooler) to control the temperature of the substrate 120. The linear deposition device 100 may also include lift pins (not shown) that facilitate loading of the substrate 120 onto the susceptor 128 or dismounting of the substrate 120 from the susceptor 128.

In one embodiment, the susceptor 128 is secured to brackets 210 that move across an extended bar 138 with screws formed thereon. The brackets 210 have corresponding screws formed in their holes receiving the extended bar 138. The extended bar 138 is secured to a spindle of a motor 114, and hence, the extended bar 138 rotates as the spindle of the motor 114 rotates. The rotation of the extended bar 138 causes the brackets 210 (and therefore the susceptor 128) to make a linear movement on the support plate 124. By controlling the speed and rotation direction of the motor 114, the speed and the direction of the linear movement of the susceptor 128 can be controlled. The use of a motor 114 and the extended bar 138 is merely an example of a mechanism for moving the susceptor 128. Various other ways of moving the susceptor 128 (e.g., use of gears and pinion or a linear motor at the bottom, top or side of the susceptor 128) may be used. Moreover, instead of moving the susceptor 128, the susceptor 128 may remain stationary and the reactors 136 may be moved.

Figure 3:
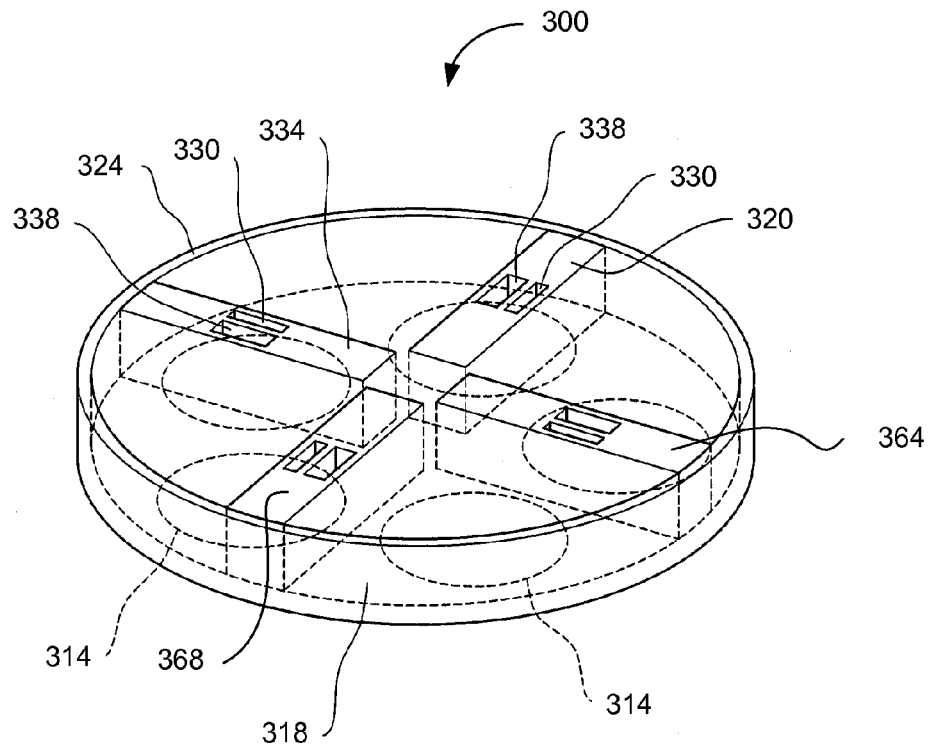
FIG. 3 is a perspective view of a rotating deposition device, according to one embodiment.

FIG. 3 is a perspective view of a rotating deposition device 300, according to one embodiment. Instead of using the linear deposition device 100 of FIG. 1, the rotating deposition device 300 may be used to perform the deposition process according to another embodiment. The rotating deposition device 300 may include, among other components, reactors 320, 334, 364, 368, a susceptor 318, and a container 324 enclosing these components. A reactor (e.g., 320) of the rotating deposition device 300 corresponds to a reactor 136 of the linear deposition device 100, as described above with reference to FIG. 1. The susceptor 318 secures the substrates 314 in place. The reactors 320, 334, 364, 368 may be placed with a gap of 0.5 mm to 1.5 mm from the substrates 314 and the susceptor 318. Either the susceptor 318 or the reactors 320, 334, 364, 368 rotate to subject the substrates 314 to different processes.

One or more of the reactors 320, 334, 364, 368 are connected to gas pipes (not shown) to provide source precursor, reactor precursor, purge gas and/or other materials. The materials provided by the gas pipes may be (i) injected onto the substrate 314 directly by the reactors 320, 334, 364, 368, (ii) after mixing in a chamber inside the reactors 320, 334, 364, 368, or (iii) after conversion into radicals by plasma generated within the reactors 320, 334, 364, 368. After the materials are injected onto the substrate 314, the redundant materials may be exhausted through outlets 330, 338. The interior of the rotating deposition device 300 may also be maintained in a vacuum state.

Although following example embodiments are described primarily with reference to the reactors 136 in the linear deposition device 100, the same principle and operation can be applied to the rotating deposition device 300 or other types of deposition device.

Figure 4:
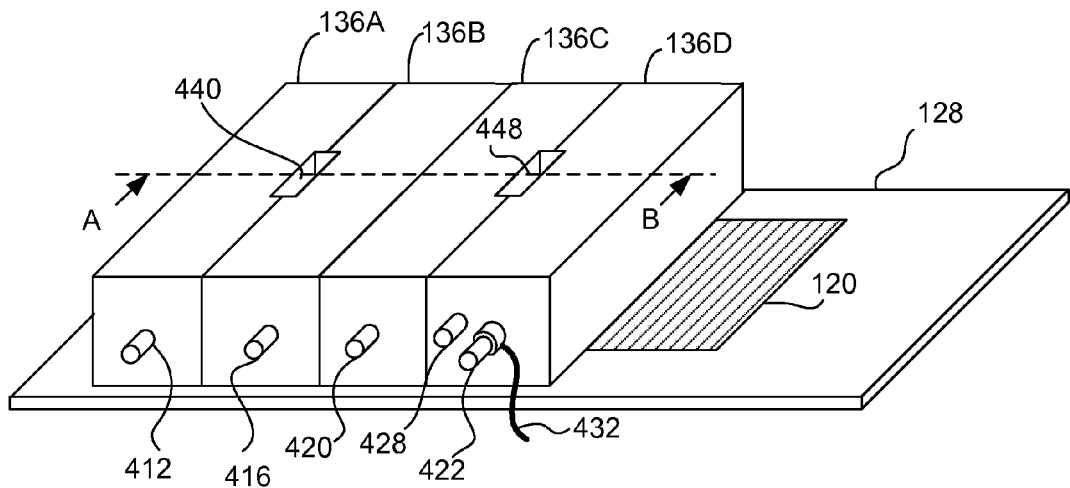
FIG. 4 is a perspective view of reactors in a deposition device, according to one embodiment.

FIG. 4 is a perspective view of reactors 136A through 136D (collectively referred to as the "reactors 136") in the deposition device 100 of FIG. 1, according to one embodiment. In FIG. 4, the reactors 136A through 136D are placed in tandem adjacent to each other. In other embodiments, the reactors 136A through 136D may be placed with a distance from each other. As the susceptor 128 mounting the substrate 120 moves from the left to the right, for example, the substrate 120 is sequentially injected with materials or radicals by the reactors 136A through 136D to form a deposition layer on the substrate 120. Instead of moving the substrate 120, the reactors 136A through 136D may move from the right to the left while injecting the source precursor materials or the radicals on the substrate 120.

In one or more embodiments, the reactors 136A, 136B, 136C are gas injectors that inject precursor material, purge gas or a combination thereof onto the substrate 120. Each of the reactors 136A, 136B, 136C is connected to pipes 412, 416, 420 to receive precursors, purge gas or a combination thereof from sources (e.g., canisters). Valves and other pipes (refer to FIG. 5) may be installed between the pipes 412, 416, 420 and the sources to control the gas and the amount thereof provided to the gas injectors 136A, 136B, 136C. Excess precursor and purge gas molecules are exhausted via exhaust portions 440, 448.

The reactor 136D may be a radical reactor that generates radicals of gas or a gas mixture received from one or more sources. The radicals of gas or gas mixture may function as purge gas, reactant precursor, surface treating agent, or a combination thereof on the substrate 120. The gas or gas mixtures are injected into the reactor 136D via pipe 428, and are converted into radicals within the reactor 136D by applying voltage across electrodes (e.g., electrode 422 and body of the reactor 136C) and generating plasma within a plasma chamber. The electrode 422 is connected via a line 432 to a supply voltage source and the body of the reactor 136, which forms a coaxial capacitive-type plasma reactor, is grounded or connected to the supply voltage source via a conductive line (not shown). The generated radicals are injected onto the substrate 120, and remaining radicals and/or gas reverted to an inactive state from the radicals are discharged from the reactor 136D via the exhaust portion 448. By exposing the substrate 120 to the radicals, the surface of the substrate maintained reactive until the next precursor is injected onto the surface of the substrate.

Figure 5:
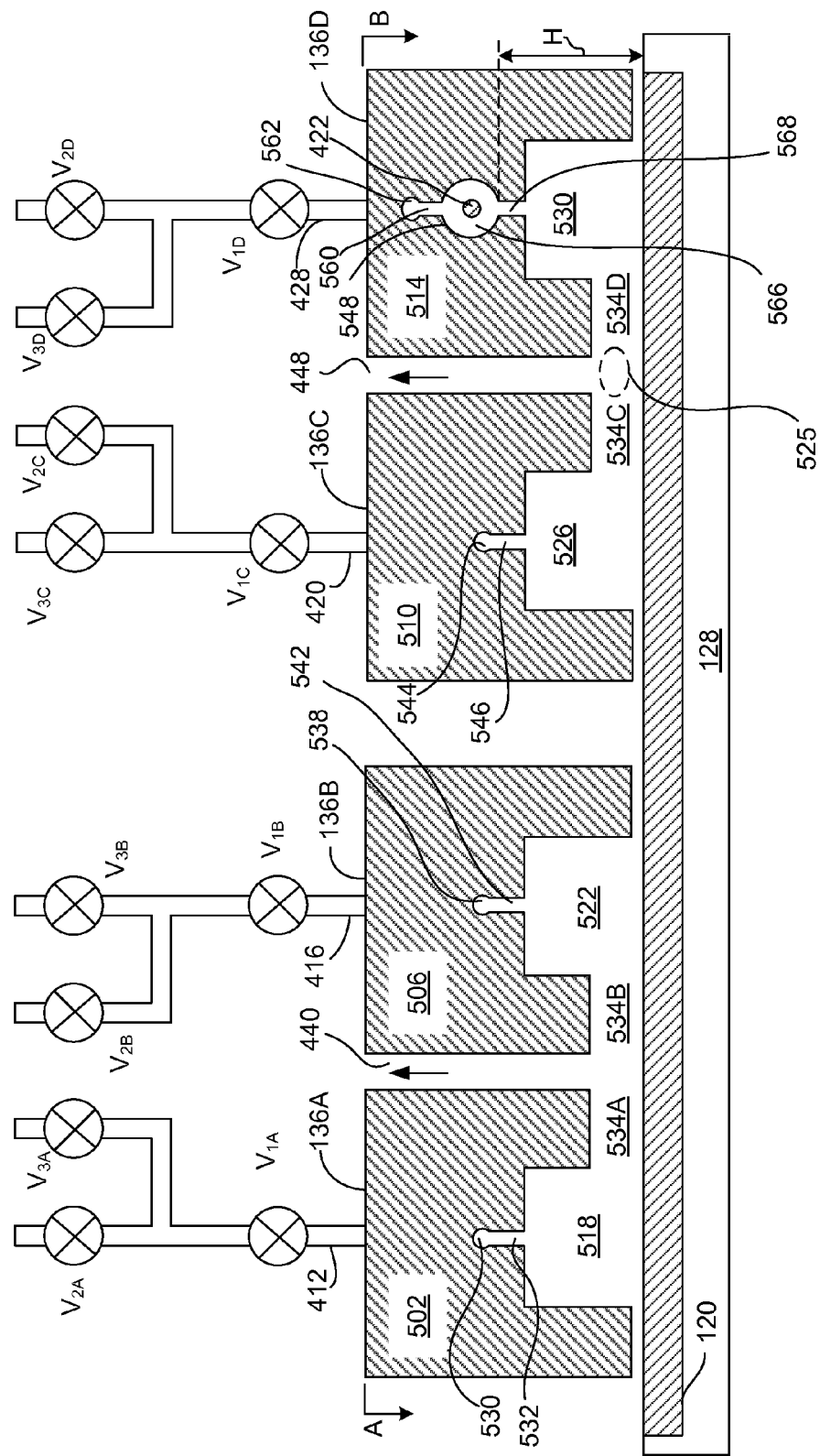
FIG. 5 is a cross sectional diagram illustrating the reactors taken along line A-B of FIG. 4, according to one embodiment.

FIG. 5 is a cross sectional diagram illustrating the reactors 136A through 136D taken along line A-B of FIG. 4, according to one embodiment. The injector 136A includes a body 502 formed with a gas channel 530, perforations (slits or holes) 532, a reaction chamber 518, a constriction zone 534A, and part of an exhaust portion 440. The gas channel 530 is connected to the pipe 412 to convey source precursor into the reaction chamber 518 via the perforations 532. The region of the substrate 120 below the reaction chamber 518 comes into contact with the source precursor and adsorbs source precursor molecules on its surface. The excess source precursor (i.e., source precursor remaining after the source precursor is adsorbed on the substrate 120) passes through the constriction zone 534A, and are discharged via the exhaust portion 440. The exhaust portion 440 is connected to an exhaust pipe (not shown).

The pipe 412 (supplying gas to the injector 136A) is connected to a valve $V_{1A}$ that controls supply of gas or mixture of gases supplied via valves $V_{2A}$ and $V_{3A}$. Each of the valves $V_{1B}$ and $V_{1C}$ may be connected to a separate gas source. The gas or mixture of gases may include carrier gas such as Ar.

While the source precursor molecules pass the constriction zones 534 physisorbed source precursor molecules are at least partially removed from the region of the substrate 120 below the constriction zone 534 due to higher flow rate of the source precursor molecules and the carrier gas (e.g., Ar).

In one or more embodiments, the injector 136B injects purge gas onto the substrate 120 to remove physiorbed source precursor molecules from the substrate 120. By injecting purge gas onto the substrate, only chemisorbed source precursor molecules remain on the substrate 120. The injector 136B has a similar structure as the injector 136A. That is, the injector 136B includes a body 506 formed with a gas channel 538, perforations (slits or holes) 542, a reaction chamber 522, a constriction zone 534B, and part of the exhaust portion 440. The gas channel 538 is connected to the pipe 416 to convey the purge gas into the reaction chamber 522 via the perforations 542. The purge gas is injected onto the region of the substrate 120 below the reaction chamber 522 and removes physisorbed source precursor from the surface of the substrate 120. The purge gas may be Argon or other inert gas. The purge gas and the removed source precursor molecules are discharged via the exhaust portion 440.

The pipe 416 (supplying gas to the injector 136B) is connected to a valve $V_{1B}$ that controls supply of gas or mixture of gases supplied via valves $V_{2B}$ and $V_{3B}$. Each of the valves $V_{2B}$ and $V_{3B}$ may be connected to a separate gas source (e.g., a canister).

In one or more embodiments, the injector 136C injects reactant precursor onto the substrate 120 to cause substitution of the source precursor or reaction of the source precursor in the substrate 120. The injector 136C has a similar structure as the injector 136A. That is, the injector 136C includes a body 510 formed with a gas channel 544, perforations (slits or holes) 546, a reaction chamber 526, a constriction zone 534C, and part of the exhaust portion 448. The gas channel 544 is connected to the pipe 420 to convey the reactant precursor into the reaction chamber 526 via the perforations 546. The reactant precursor is injected onto the region of the substrate 120 below the reaction chamber 526. The excess reactant precursor is discharged via the exhaust portion 448.

The pipe 420 (supplying gas to the injector 136C) is connected to a valve $V_{1C}$ that controls supply of gas or mixture of gases supplied via valves $V_{2C}$ and $V_{3C}$. Each of the valves $V_{2C}$ and $V_{3C}$ may be connected to a separate gas source (e.g., a canister).

The radical reactor 136D has a similar structure as the injectors 136A, 136B, 136C except that the radical reactor 136D further includes a plasma generator. The plasma generator includes an inner electrode 422 and an outer electrode 548 surrounding a plasma chamber 566 (the outer electrode 548 may be part of a conductive body 514). The body 514 is formed with, among others, a gas channel 562, perforations (slits or holes) 560, a plasma chamber 566, an injector slit 568, a reaction chamber 530 and part of the exhaust portion 448. A gas or a mixture of gases is injected via the pipe 428, channel 562 and perforations 560 into the plasma chamber 566. By applying a voltage difference between the inner electrode 422 and the outer electrode 548, plasma is generated in the plasma chamber 566. As a result of the plasma, radicals of the gas or the mixture of gases are generated within the plasma chamber 566. The generated radicals are injected into the reaction chamber 530 via the injector slit 568. The region of the substrate 120 below the reaction chamber 526 comes into contact with the radicals, and is thereby treated to have a reactive surface.

The plasma generator including the inner electrode 422, the outer electrode 548 and the plasma chamber 566 are advantageously located away from the substrate 120. By locating the plasma generator away from the substrate 120, plasma generated by the plasma generator does not affect or damage devices already formed on the substrate 120. However, radicals generally have a limited lifespan. Hence, if distance H of the plasma chamber 566 from the substrate 120 is too large, most of the generated radicals revert to an inactive state before reaching the substrate 120. Therefore, distance H may be set to a value below a threshold. In one embodiment, distance H is less than 8 cm.

In one embodiment, inert gas (e.g., Ar) is injected into the radical reactor 136D alone or in combination with other gases. The radicals react with the deposited layer and cause the surface of the deposited layer to have a reactive surface, as described below in detail with reference to FIGS. 6E and 6F. Some of the radicals revert back to an inactive state and function as a purge gas, removing excess reactant precursor molecules from the surface of the substrate 120.

The pipe 428 (supplying gas to the radical reactor 136D) is connected to a valve $V_{1D}$ that controls supply of gas or mixture of gases supplied via valves $V_{2D}$ and $V_{3D}$. Each of the valves $V_{2D}$ and $V_{3D}$ may be connected to a gas source.

The reactor modules 136A through 136D and their arrangement as illustrated in FIG. 5 are merely illustrative. In other embodiment, more than one radical reactor may be used. For example, the injector 136B may be replaced with a radical reactor (similar to the radical reactor 136D).

Example of Performing Molecule Layer Deposition

Molecular layer deposition (MLD) enables deposition of hybrid organic-inorganic polymer on a substrate. Method of performing MLD includes injecting source precursor or metal molecules onto the substrate. Conventional method of performing MLD results in a hybrid organic-inorganic polymer layer with lower density, and generally needs nucleation sites on the substrate or device to have source precursor molecules adsorbed in the substrate.

Figure 6A:
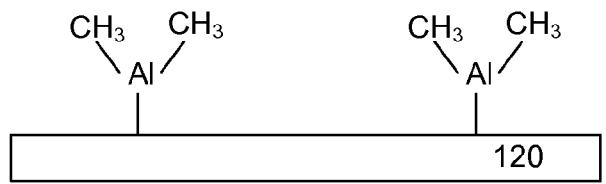
FIGS. 6A through 6F are diagrams illustrating molecules deposited on a substrate during a molecular layer deposition (MLD) process, according to one embodiment.
Figure 6B:
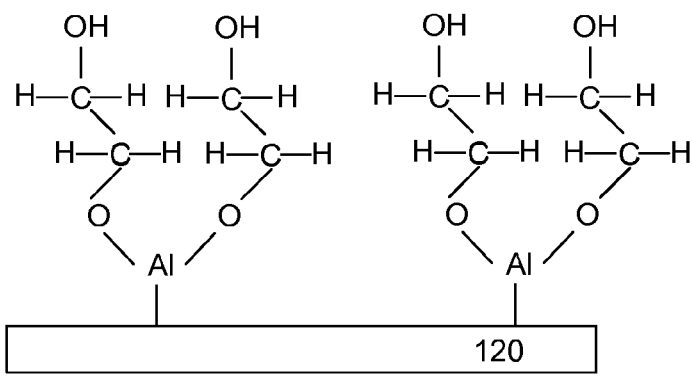

A conventional way of depositing a hybrid organic-inorganic polymer on a substrate is, for example, by using Trimethylaluminium (TMA) as the source precursor and ethylene glycol as the reactant precursor. By depositing the substrate to the TMA, $AlCH_3$ as illustrated in FIG. 6A is formed on the substrate. Then ethylene glycol is injected onto the substrate, forming a layer of a hybrid organic-inorganic layer on the substrate, as illustrated in FIG. 6B. A stable hydroxide (OH) group is formed at the surface of the deposited layer. The hydroxide group is not reactive, and hence, the types of subsequent source precursor molecules that can be subsequently deposited are limited. Moreover, the carbon atoms are not cross-linked between the molecules in FIG. 6B, rendering the deposited layer to have low strength and low melting temperature.

Embodiments relate to performing radical bombardment on the substrate previously deposited with a layer. By subjecting the deposited layer of the substrate to the radicals, the deposited layer can be placed in a reactive state where further precursor molecules can be deposited in a subsequent process. Further, embodiments relate to exposing either source precursor or reactant precursor to the surface of the substrate previously exposed by radicals or to cross-link molecules in the layer deposited on the substrate. The resulting molecular layer may be used as a replacement for organic layers that are used in high temperature or layers that require low moisture permeability.

Taking an example of depositing a layer of alucone on the substrate 120, the substrate 120 is injected with Trimethylaluminium (TMA) as the source precursor and ethylene glycol as the reactant precursor. Using the reactors as described in FIGS. 4 and 5, the injector 136A injects the TMA onto the substrate 120. The substrate 120 is moved to the right and then injected with a purge gas (e.g., Argon) by the injector 136B to remove physisorbed TMA from the surface of the substrate 120. FIG. 6A is a diagram illustrating AlCH$_3$ adsorbed on the surface of the substrate 120 after injecting the purge gas by the injector 136B, according to one embodiment.

Then the ethylene glycol is injected onto the substrate by the injector 136C. The ethylene glycol is injected into the reaction chamber 526 and then exhausted via a constriction zone 534C and an exhaust zone 525 (connected to the exhaust portion 448).

Figure 6C:
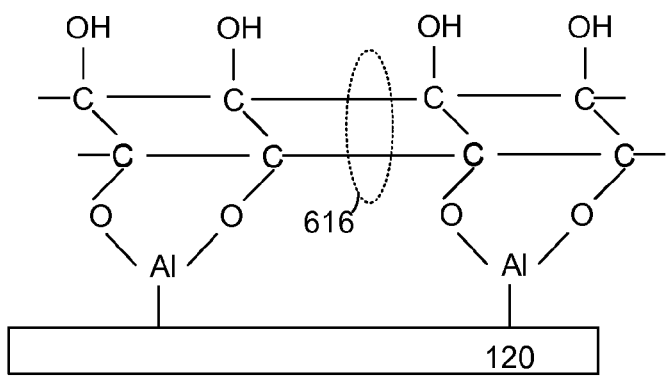
Figure 6D:
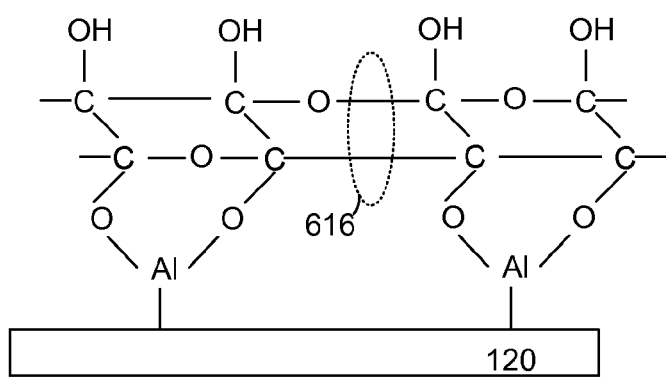

The radical reactor 136D may be supplied with inert gas (e.g., Argon) or a mixture of inert gas and other gases (e.g., H$_2$) to generate the radicals. In one embodiment, the radical reactor 136D generates H* radicals and Ar* radicals that are injected onto the substrate 120. The mixture ratio of Ar and H$_2$ gas for generating the radicals may be in the range of 10:1 to 1:10. The radicals travel to the constriction zone 534C and the exhaust zone 525, react with ethylene glycol and deposit a layer as shown in FIGS. 6C and 6D. Specifically, the radicals break C—C bonds in ethylene glycol, and enable the compound to combine with AlCH$_3$ formed on the substrate 120. As a result of combining AlCH$_3$ with ethylene glycol, the deposited layer has cross-linking 616 between the molecules (see FIGS. 6C and 6D). The cross-linking 616 enhances the characteristics (e.g., higher strength and higher melting point) of the polymer layer due to strong bonding between the molecules.

Figure 6E:
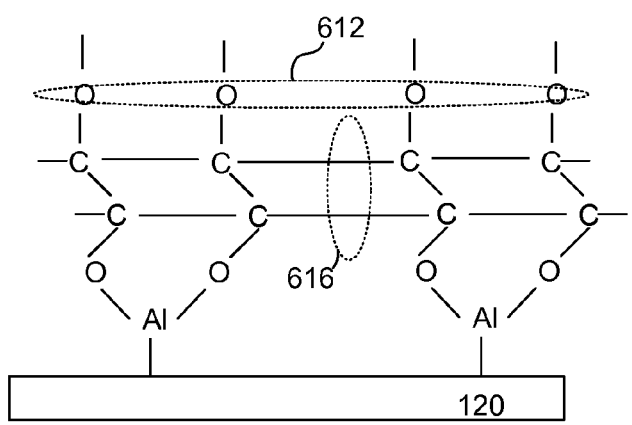
Figure 6F:
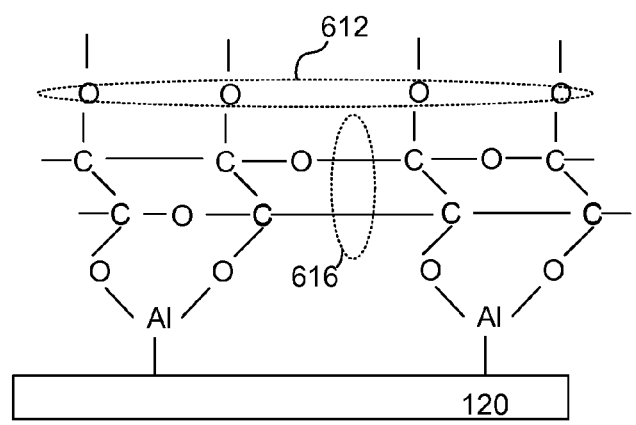
Figure 6G:
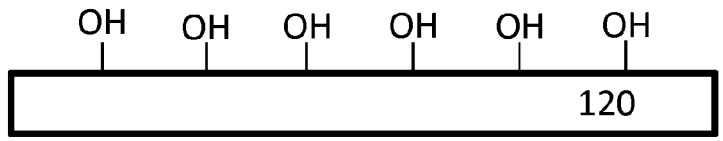
FIGS. 6G through 6K are diagrams illustrating molecules deposited on a substrate during a MLD process, according to another embodiment.

The substrate 120 is further moved to the right so that the portion of the substrate 120 deposited with the layer of FIGS. 6C and 6D is placed below the reaction chamber 530. As the substrate 120 is bombarded with Ar* radicals and/or H* radicals, the bonds between carbon atoms and/or hydrogen atoms are broken, as shown in FIGS. 6E and 6F. Therefore, the oxygen atoms 612 and broken bonds of carbons become reactive, thereby facilitating adsorption of or linking with subsequent precursor molecules injected onto the substrate 120. Due to the reactive oxygen atoms 612 and carbon atoms, source precursor that otherwise does not react with the deposited layer can now be deposited effectively in a subsequent step, thereby increasing the deposition rate as well as increasing the variety of materials that can be incorporated into an organic polymer-metal interlaced structure.

For example, TMA may again be injected onto the substrate to link Aluminum molecules to the oxygen atoms 612. Other metal or chemical compounds may be deposited instead of Aluminum molecules. The substrate 120 may then undergo subsequent steps (e.g., injection of purge gas, the reactant precursor, and then radicals) to deposit another layer of hybrid polymer on the substrate 120. The steps may be repeated to obtain a hybrid polymer layer of a desired thickness.

In one embodiment, aromatic hydrocarbon precursors (e.g., mono-substituted benzene derivative including toluene and aniline) may also be used as a reactant precursor for depositing a layer on a substrate. These aromatic hydrocarbon precursors may advantageously provide more cross-linking because of higher number of carbon atoms and bonds. When aromatic hydrocarbon precursors are used as the reactant precursor, the radicals break up the hydrocarbon rings, generating a carbon group having no terminated (or occupied) atoms. The carbon group facilitates adsorption of source precursor molecules subsequently injected onto the substrate 120. Due to the large number of potential carbon atoms without terminated (or occupied) atoms created by breaking up of the benzene ring, the number of nucleation sites on the deposited layer for the attachment of subsequent source precursor molecules is increased significantly.

Figure 7A:
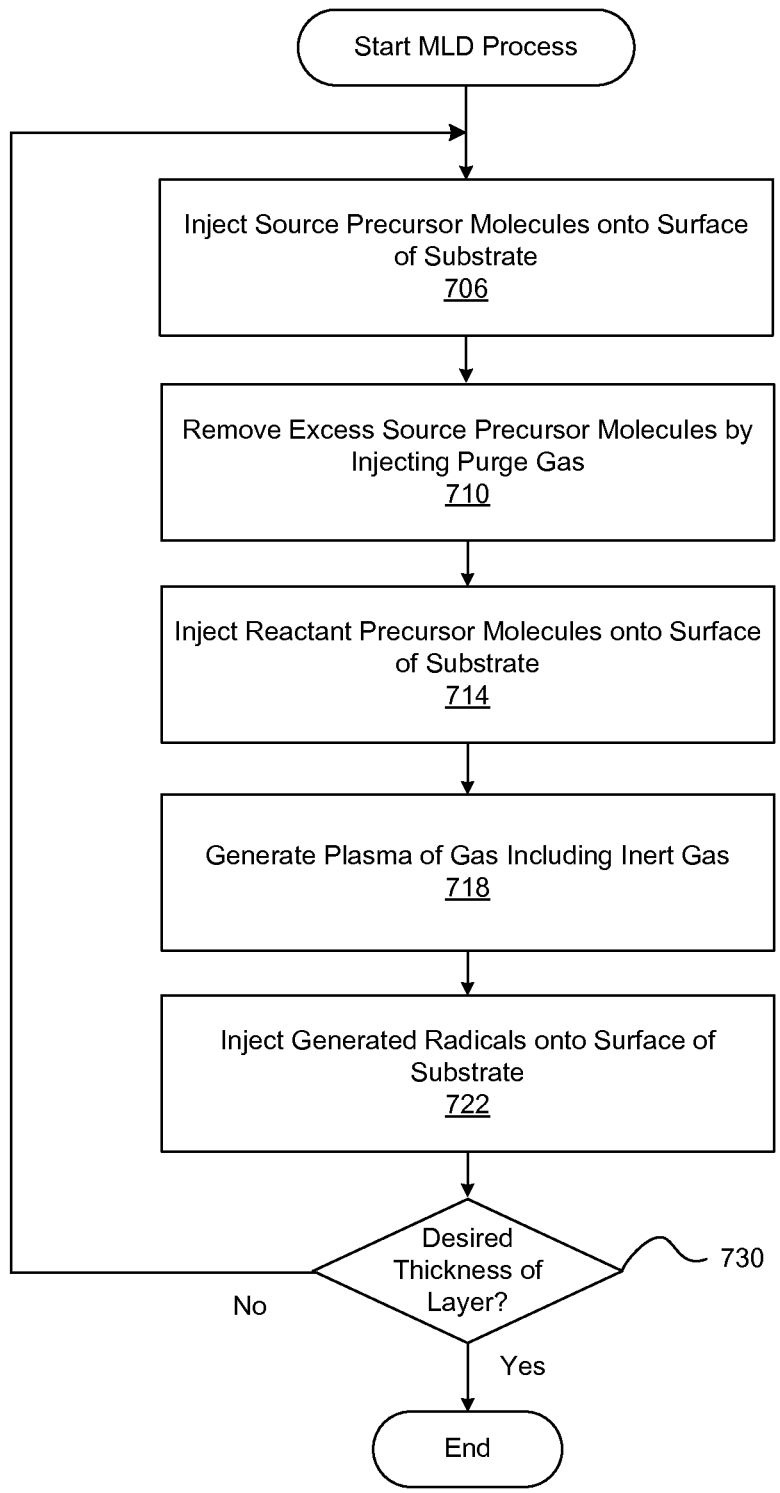
FIG. 7A is a flowchart illustrating a process of performing MLD, according to one embodiment.

FIG. 7A is a flowchart illustrating a process of performing MLD, according to one embodiment. First source precursor molecules (e.g., TMA molecules) are injected 706 onto the substrate 120 by the injector 136A. The substrate is then moved below the injector 136B and then injected with purge gas to remove 710 excess source precursor molecules (i.e., physisorbed source precursor molecules) from the substrate 120. Then, the reactant precursor molecules (e.g., ethylene glycol molecules) are injected 714 onto the substrate 120 to deposit a hybrid organic-inorganic polymer layer on the substrate 120. The reactant precursor molecules may react with radicals and then the source precursor to form a layer of molecular layer on the substrate 120.

Subsequently, plasma of gas is generated 718 in the radical reactor 136C. The gas includes, among other gases, inert gas such as Argon. The generated radicals are then injected 722 onto the surface of the substrate 120 to place molecules in the deposited layer in a reactive state for linking with subsequent material injected onto the substrate 120. The radicals reverted to an inactive state may function as a purge gas that removes physisorbed reactant precursor molecules from the surface of the substrate 120.

It is then determined 730 whether the deposited layer is of a desired thickness. If not, the process returns to injecting 706 the source precursor molecules onto the surface of the substrate and repeats the subsequent processes. If the desired thickness of deposited layer is obtained, the process terminates.

In another embodiment, nucleation sites are generated on the substrate before performing the steps of FIG. 7A. First, TMA is injected onto the substrate as the source precursor. Subsequently, ethylene glycol is injected onto the substrate as the reactant precursor to form a layer as illustrated in FIG. 6B. Then, the substrate is injected with radicals (or active species) to convert a stable hydroxide (OH) group into reactive oxygen group or carbon group having no terminated (or occupied) atoms. The deposited material with reactive oxygen and/or carbon atoms function as nucleation sites onto which TMA and ethylene glycol can be injected to form a hybrid organic-inorganic polymer layer.

The bonding between the interface of each monomer is strong, and therefore, multiple layers of hybrid polymer formed by embodiments have superior characteristics (e.g., higher melting point and strength) compared to hybrid polymer formed by conventional methods. Hence, the hybrid polymer formed according to the embodiment may be used in high temperature. Further, the hybrid polymer formed according to the embodiment may exhibit a higher contact angle, meaning that the hybrid polymer is hydrophobic. Therefore, the deposited hybrid polymer may be used as a layer for preventing infiltration of moisture.

In another embodiment, aromatic hydrocarbon molecules may be used as precursor in a MLD process to deposit polymer on the substrate. The benzene ring of aromatic hydrocarbon (e.g., toluene and aniline) adsorbed on the substrate may be broken by radicals, rendering the surface of the substrate to become reactive by have carbon group with no terminated (or occupied) atoms. The same aromatic hydrocarbon or another precursor material may be injected onto the reactive surface to form a organic or hybrid polymer on the substrate. In the following example, toluene is used as the source precursor but a different aromatic hydrocarbon may be used to deposit polymer on the substrate.

Figure 6H:
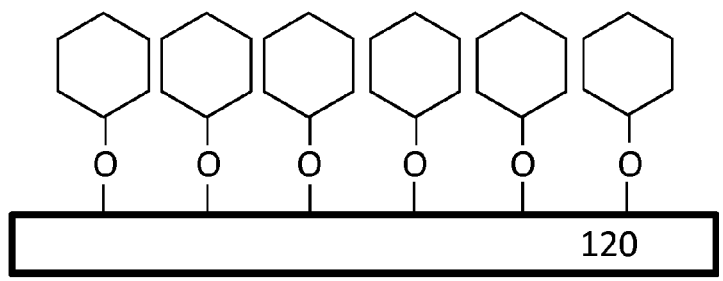
Figure 6I:
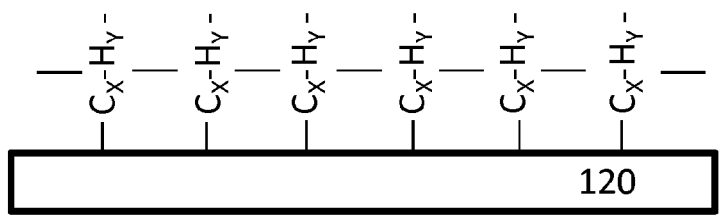
Figure 6J:
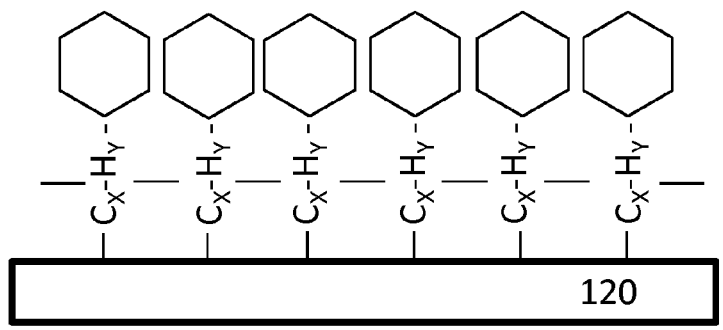

FIGS. 6G through 6K are diagrams illustrating depositing of a polymeric layer using toluene as source precursor of an MLD process, according to one embodiment. FIG. 7B is a flowchart illustrating the process of depositing the polymeric layer, according to one embodiment. As shown in FIG. 6B, a substrate 120 with a hydroxylated surface is provided. The substrate with the hydroxylated surface moves from the left to the right as shown in FIG. 5. First, the substrate with the hydroxylated surface is injected with purge gas (e.g., Ar gas) by the first injector 136A to remove any excess molecules remaining on the substrate.

Then the substrate 120 moves to the right in FIG. 5 and is injected 740 with aromatic hydrocarbon (e.g., mono-substituted benzene derivatives including toluene and aniline, and derivatives of benzene) or aliphatic compound containing single hydroxyl groups or single amine groups by the injector 136B. As a result, by-product $CH_4$ and a layer of material as shown in FIG. 6H is deposited on the substrate 120. The substrate 120 with toluene absorbed on its surface as illustrated in FIG. 6H is stable and no further chemical adsorption is likely to occur unless the surface is rendered reactive.

The substrate 120 may then be injected 744 with a purge gas (e.g., Ar gas) by the injector 136C to remove any physisorbed toluene from the surface of the substrate 120. Subsequently, the radical reactor 136D generates 748 and injects 752 radicals of inert gas (e.g., Ar*) onto the surface of the substrate as reactant precursor. The radicals break the hydrocarbon rings of the material adsorbed on the substrate, and causes the surface to have a monomer molecular layer and become reactive due to carbon group with no terminated (or occupied) atoms as illustrated in FIG. 6I.

It is then determined if the thickness of the layer deposited on the substrate 120 is of a desired thickness 758. If the thickness is sufficient, the process terminates. However, if the thickness is insufficient, the substrate 120 reverts to its original location and is again injected with the purge gas by the injector 136A to remove any redundant material from the surface of the substrate 120. Subsequently, the injector 136B again injects 744 toluene molecules onto the substrate as the substrate moves to the right as shown in FIG. 5. As a result, toluene molecules are attached to the monomer molecular layer as illustrated in FIG. 6J. The injector 136C injects purge gas to remove 744 the redundant toluene molecules from the surface of the substrate 120.

Figure 6K:
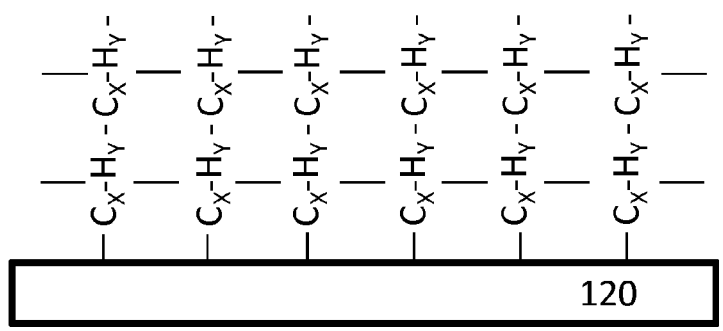
Figure 7B:
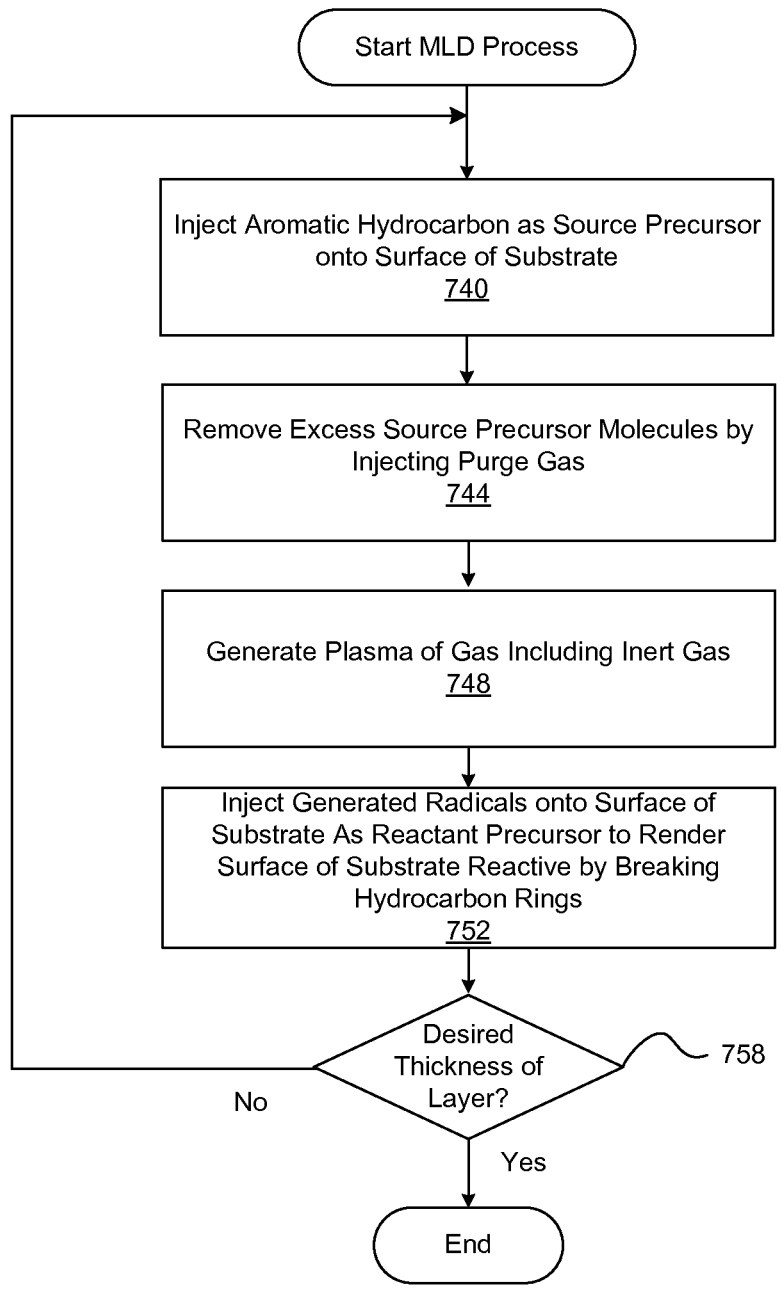
FIG. 7B is a flowchart illustrating a process of performing MLD, according to another embodiment.

Subsequently, the radicals are again injected 748 onto the substrate by the radical reactor 136D to break hydrocarbon rings of the adsorbed toluene molecules, creating a polymeric layer on the substrate 120 as illustrated in FIG. 6K. The process may be repeated for a number of times to deposit a polymer of a desired thickness.

In other embodiment, a different aromatic hydrocarbon or material may be used as the source precursor at one or more iteration of the process to deposit a hybrid polymer instead of injecting the same aromatic hydrocarbon as the source precursor.

Enhanced Atomic Layer Deposition Using Radicals

Embodiments relate to an enhanced ALD process where source precursor molecules are exposed to radicals of inert gas to disassociate the source precursor molecules before or after exposing a substrate to the source precursor molecules. By disassociating the source precursor molecules, the source precursor molecules are activated into a high energy state, which facilitates the adsorption of the source precursor molecules onto the surface of the substrate. The radicals may then revert to an inactive state. The reverted inert gas also functions as a purge gas that removes physisorbed source precursor molecules from the surface of the substrate, obviating the need for a separate purge process.

Figure 8:
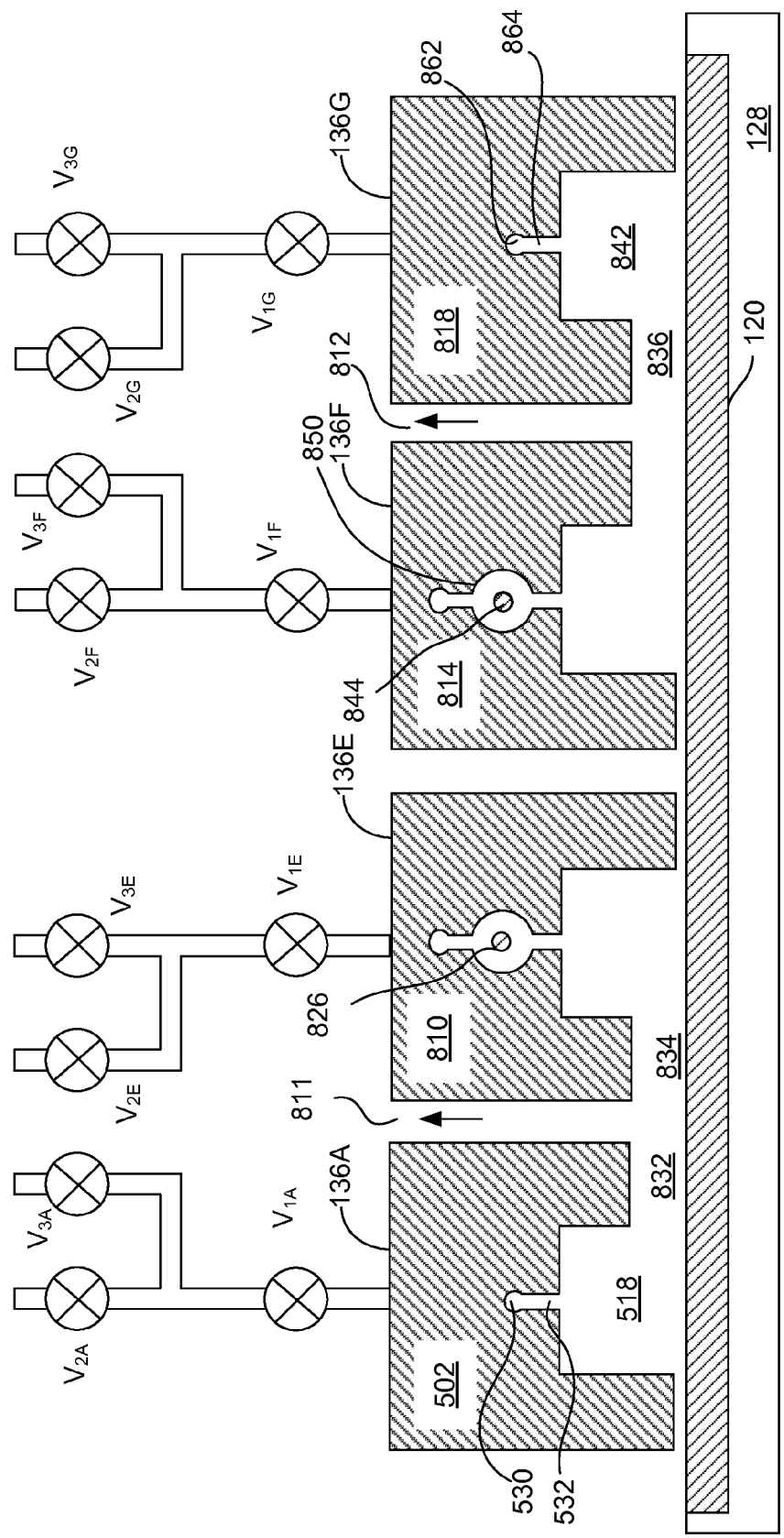
FIG. 8 is a cross sectional diagram illustrating reactors for performing enhanced atomic layer deposition (ALD), according to one embodiment.

FIG. 8 is a cross sectional diagram illustrating reactors for performing enhanced atomic layer deposition (ALD), according to one embodiment. The reactor includes an injectors 136A, 136G and radical reactors 136E, 136F. The injector 136A, 136G inject material onto the surface of the substrate 120. The radical reactors generate plasma for generating radicals injected onto the surface of the substrate 120. In one embodiment, the injectors 136A, 136G and the radical reactors 136E, 136F are arranged so that the substrate 120 is exposed to the material injected by the injector 136A, then exposed to the radicals generated by the radical reactors 136E, 136F and then finally to the material injected by the injector 136G.

The injector 136A is connected to a pipe 412 for receiving gas passing through valves $V_{1A}$, $V_{2A}$ and $V_{3A}$. The structure of injector 136A of FIG. 8 is the same as the structure of injector 136A described above with reference to FIG. 5, and therefore, the explanation thereof is omitted herein for the sake of brevity.

In one embodiment, source precursor gas is injected onto the substrate 120 by the injector 136A. The source precursor gas for enhanced ALD may include, among other precursors, inorganic compounds such as SiH4, TiCl4, SiCl2H2, HfCl4, WF6, and metal-organic compounds such as Tris-dimethylaminosilane $[(CH_3)_2NSiH]$, and Tetrakis(ethylmethylamino)silicon $[\{(CH_3)(C_2H_5)N\}_4Si]$. These inorganic compounds and organic compounds are not easily absorbed into a substrate, and hence, generally results in a slow deposition rate and a layer with poor properties.

The radical reactor 136E generates radicals of gas or a gas mixture received from one or more sources. The gas or gas mixture injected into the radical reactor 136E include inert gas (e.g., Argon). The structure of the radical reactor 136E is substantially identical to the structure of radical reactor 136D described above with reference to FIG. 5, and therefore, the detailed description thereof is omitted herein for the sake of brevity. The gas or gas mixtures are injected into the radical reactor 136E via valves $V_{1E}$, $V_{2E}$, $V_{3E}$, and are converted into radicals within the radical reactor 136E by applying voltage across an inner electrode 826 and a conductive body 810. The radicals generated in the radical reactor 136E are injected onto the substrate 120, and remaining radicals and/or gas reverted to inactive state are discharged from the radical reactors 136E, 136F via exhaust portions 811, 812.

By exposing the source precursor molecules to the radicals generated by the radical reactor 136E, the source precursor molecules are disassociated. The disassociation of the source precursor molecules is advantageous since the disassociated source precursor molecules can be adsorbed onto the surface of the substrate 120 more easily, resulting in increase in the deposition rate.

After the radicals disassociate the source precursors on the surface of the substrate 120, the radicals revert to an inert state. The reverted purge gas passes through the constriction zone 834, performing the purge operation of removing excess source precursor molecules from the surface of the substrate 120.

In one embodiment, as the substrate 120 moves to the right side, the radical reactor 136F injects reactant precursor onto the substrate 120. The radical reactor 136F has a similar structure as the radical reactor 136E but uses a different gas. The radical reactor 136F may include, among other components, an inner electrode 844 and an outer electrode 850 (implemented as a body 814 of the radical reactor 136F). The radicals react with the source precursor molecules adsorbed in the substrate 120 or replace the source precursor molecules to form a layer.

In one embodiment, the radical reactor 136F produces N* radical (for example, using $NH_3$ as the reactant precursor). As a result of reaction with the source precursor molecules or replacement of the source precursor molecules, a SiN is formed on the substrate 120.

Excess radicals or gas reverted from the radicals are discharged via an exhaust portion 812.

The injector 136G has a channel 862 and holes or slit 864 for conveying the purge gas to a reaction chamber 842. Purge gas is injected into the injector 136G via the channel 862 and holes or slit 864. As the purge gas moves into the reaction chamber 842 and then through a constriction zone 836, the purge gas removes the excess reactant precursor from the substrate 120. The purge gas is the discharged via the exhaust portion 812.

Figure 9:
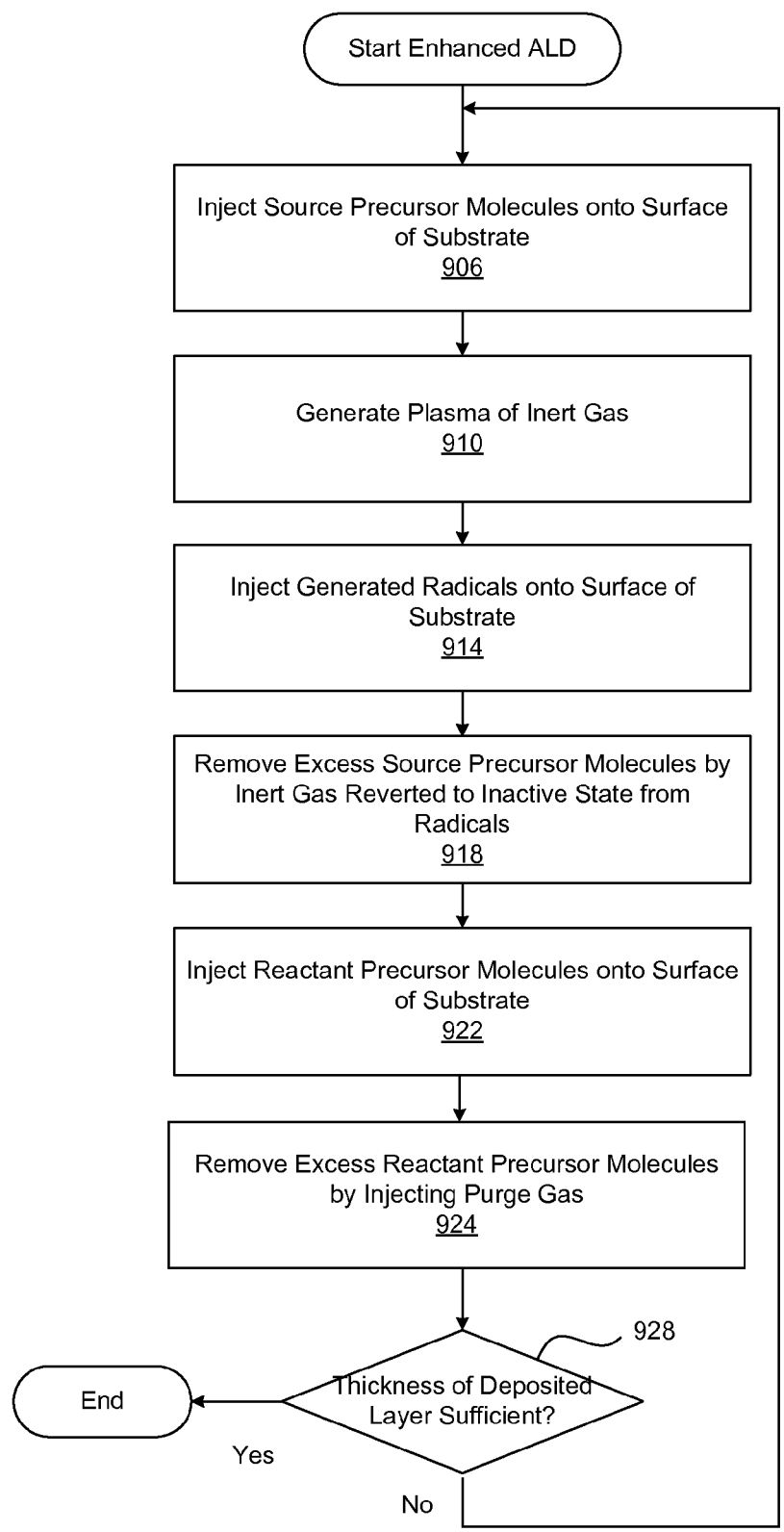
FIG. 9 is a flowchart illustrating a process of performing enhanced ALD, according to one embodiment.

FIG. 9 is a flowchart illustrating a process of performing enhanced ALD, according to one embodiment. The injector 136A injects 906 source precursor molecules onto the surface of substrate 120.

Plasma of inert gas (e.g., Ar) is generated 910 by the radical reactor 136E. The radicals generated are injected 914 onto the surface of the substrate previously exposed to the source precursor molecules. The radicals disassociate the source precursor molecules and facilitate absorption of the dissociated molecules in the substrate 120. At least part of the radicals revert to an inert state and removes 918 excess source precursor molecules from the substrate 120.

The reactant precursor molecules are then injected 922 by the radical reactor 136F onto the surface of the substrate 120. The injector 136G removes 924 excess reactant precursor molecules by injecting purge gas onto the surface of the substrate 120.

If it is determined 928 that the thickness of deposited layer is not sufficient or a predetermined number of repetition has not yet been reached, then the process returns to injecting 906 the source precursor molecules onto the surface of the substrate and repeats the subsequent steps. Conversely, if it is determined 928 that the thickness of deposited layer is sufficient or a predetermined number of predetermined iteration has been reached, the process terminates.

The source precursors, the reactant precursors and the layer deposited on the substrate are merely examples. Various other source precursors may be disassociated by using the radicals of inert gas. Further, layers other than SiN may be formed on the substrate.

Enhanced Chemical Vapor Deposition Using Radicals

The same principle is not limited to ALD but can also be applied to chemical vapor deposition (CVD). CVD differs from ALD in that the precursors are created by mixing materials at a location away from the substrate (not on the substrate) and then exposing the substrate to the precursors. The injector 136A and the radical reactor 136E of FIG. 8 may be used for performing CVD on the substrate 120 (the radical reactors 136F and the injector 136G are not used in this example).

To perform CVD, the source precursor is injected into the injector 136A, passes through the reaction chamber 518 and the constriction zone 832 into the exhaust portion 811. The source precursor may include inorganic compounds such as $SiH_4$, $TiCl_4$, $SiCl_2H_2$, $HfCl_4$, $WF_6$, and metal-organic compounds such as Trimethylaluminum [$(CH_3)_3Al$], Tris-dimethylaminosilane [$(CH_3)_2NSiH$], and Tetrakis(ethylmethylamino)silicon [$\{(CH_3)(C_2H_5)N\}_4Si$].

Reactant precursor (e.g., $O_2$, $O_3$, $H_2O$, $N_2$, $NH_3$, $N_2O$, $H_2$ and $CH_4$) is injected into the remote plasma generator 136E. The radicals (e.g., O* radicals, N* radicals, C* radicals and H* radicals) of the reactant precursor are generated at the radical reactor 136E by applying voltage across the electrode 826 and the body 810. The generated radicals then enter the constriction zone 834 and then discharge via the exhaust portion 811. The radicals and the source precursor materials interact in the exhaust portion 811 and deposit a layer (e.g., SiON and AlON) on the substrate 120 in the exhaust portion 811.

Figure 10:
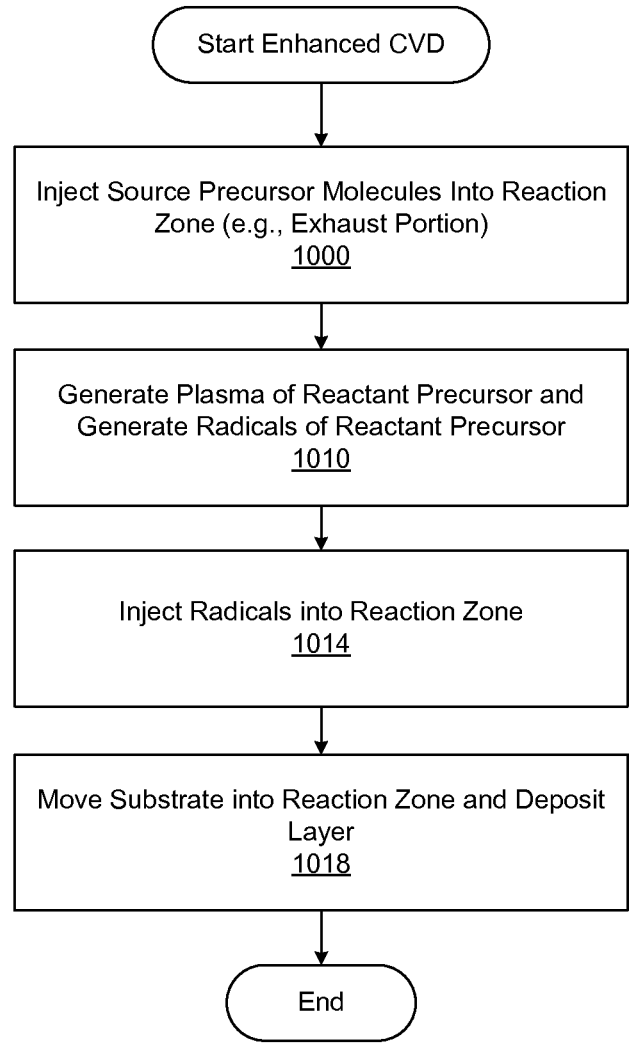
FIG. 10 is a flowchart illustrating a process of performing chemical vapor deposition (CVD), according to one embodiment.

FIG. 10 is a flowchart illustrating a process of performing chemical vapor deposition (CVD), according to one embodiment. First, source precursor molecules are injected 1000 into a reacting zone (e.g., exhaust portion 811) by the injector 136A. The radical reactor 136E generates 1010 plasma of reactant precursor. The radicals generated at the radical reactor 136E are then injected 1014 into the reacting zone. The radicals of the reactant precursor molecules and the source precursor molecules react in the reacting zone. As the substrate moves 1018 into the reacting zone, a layer of material is deposited on the substrate.

The enhanced CVD process may be iterated for a number of passes through the reactors to obtain a deposit layer of a desired thickness.

Note that either in the ALD or CVD processes described, the radicals are generated at a location (specifically, within the plasma chamber) that is located away from the substrate. The plasma for generating the radicals does not interact with the substrate, and hence, the plasma does not damage the substrate or any device formed on the substrate.

Although the present invention has been described above with respect to several embodiments, various modifications can be made within the scope of the present invention. Accordingly, the disclosure of the present invention is intended to be illustrative, but not limiting, of the scope of the invention, which is set forth in the following claims.

What is claimed is:

1. A method of performing a molecular layer deposition, comprising:
    (a) injecting a first source precursor onto a substrate;
    (b) injecting a first reactant precursor on the substrate injected with the first source precursor to deposit a layer of metal-containing hybrid organic-inorganic polymer on the substrate, wherein the first reactant precursor comprises an organic compound;
    (c) generating radicals of a gas or a mixture of gases;
    (d) injecting the generated radicals onto the deposited layer to place the deposited layer in a reactive state, the generated radicals different from the first reactant precursor; and
    (e) injecting a second source precursor onto the substrate with the deposited layer in the reactive state, the adsorption of the second source precursor on the deposited layer facilitated by an increased number of nucleation sites on the deposited layer generated by placing the deposited layer in the reactive state.

2. The method of claim 1, further comprising injecting a purge gas onto the substrate after injecting the first precursor and before injecting the first reactant precursor to remove physisorbed first source precursor from the substrate.

3. The method of claim 1, wherein a physisorbed layer deposited on the substrate is removed by the gas or the mixture of gases reverted to an inactive state.

4. The method of claim 1, further comprising:
    (f) injecting a second reactant precursor different from the first reactant precursor reactant precursor onto the substrate injected with the second source precursor;
    (g) generating and injecting radicals of gas or mixture of gases onto the substrate injected with the second reactant precursor; and (h) repeating (a) through (g) for a predetermined number of times to deposit a hybrid organic-inorganic polymer on the substrate.

5. The method of claim 1, wherein the first source precursor is metal-organic precursors and the first reactant precursor is diols or aromatic hydrocarbons.

6. The method of claim 5, wherein the diols comprise ethylene glycol.

7. The method of claim 5, wherein the aromatic hydrocarbons comprise aniline and toluene.

8. The method of claim 1, wherein the radicals are generated at a location remote from the substrate.

9. The method of claim 1, wherein the deposited layer is polymeric atomic layer where carbon atoms are cross-linked between a plurality of molecules.

10. A method of performing atomic layer deposition, comprising:
   injecting source precursor onto a substrate;
   generating and injecting radicals of inert gas onto the substrate to disassociate molecules of the source precursor adsorbed on the substrate after injecting the source precursor onto the substrate; and
   after injecting the radicals of inert gas, injecting reactant precursor onto the substrate injected with the radicals to deposit a layer on the substrate by reacting or replacing the disassociated molecules on the substrate.

11. The method of claim 10, further comprising:
   removing physisorbed source precursor from the substrate by inert gas reverted from the radicals.

12. The method of claim 10, further comprising:
   injecting purge gas onto the substrate deposited with the layer to remove physisorbed material from the substrate.

13. The method of claim 10, wherein the source precursor is one selected from a group consisting of $SiH_4$, $TiCl_4$, $SiCl_2H_2$, $HfCl_4$, $WF_6$, and metal-organic compounds.

14. The method of claim 13, wherein the metal-organic compound is one selected from a group consisting of Trimethylaluminum [$(CH_3)_3Al$], Tris-dimethylaminosilane [$(CH_3)_2NSiH$], and Tetrakis(ethylmethylamino)silicon [$\{(CH_3)(C_2H_5)N\}_4Si$] and the reactant precursor comprises $NH_3$.

15. A method of performing a molecular layer deposition, comprising:
   (a) injecting aromatic hydrocarbon as source precursor onto a surface of a substrate;
   (b) injecting purge gas after injecting the aromatic hydrocarbon on the surface of the substrate to remove physisorbed aromatic hydrocarbon from the surface of the substrate;
   (c) after purging the aromatic hydrocarbon, injecting radicals of inert gas onto the surface of the substrate injected with the aromatic hydrocarbon to break hydrocarbon rings on the surface of the substrate and render the surface reactive; and
   (d) repeating (a) through (c) to form a polymeric layer on the substrate.

16. The method of claim 15, further comprising:
   removing physisorbed source precursor from the substrate by inert gas reverted from the radicals.

17. The method of claim 15, wherein the aromatic hydrocarbon is mono-substituted benzene derivative.

18. The method of claim 15, further comprising moving the substrate below an injector configured to inject the aromatic hydrocarbon and a radical reactor configured to inject radicals of the inert gas.

19. The method of claim 15, wherein the radicals are generated at a location remote from the surface of the substrate.

* * * * *